(12) United States Patent
Kim

(10) Patent No.: US 9,065,078 B2
(45) Date of Patent: Jun. 23, 2015

(54) METHOD OF MANUFACTURING ORGANIC LIGHT EMITTING DISPLAY PANEL

(71) Applicant: Samsung Display Co., Ltd., Yongin, Gyeonggi-Do (KR)

(72) Inventor: Gun Mo Kim, Chungcheongnam-do (KR)

(73) Assignee: SAMSUNG DISPLAY CO., LTD., Yogin, Gyeonggi-Do (KR)

( * ) Notice: Subject to any disclaimer, the term of this patent is extended or adjusted under 35 U.S.C. 154(b) by 0 days.

(21) Appl. No.: 14/022,679

(22) Filed: Sep. 10, 2013

(65) Prior Publication Data

US 2014/0332765 A1    Nov. 13, 2014

(30) Foreign Application Priority Data

May 13, 2013    (KR) .......................... 10-2013-0053951

(51) Int. Cl.
    *H01L 51/56*    (2006.01)
    *H01L 51/52*    (2006.01)
    *H01L 21/02*    (2006.01)

(52) U.S. Cl.
    CPC ............ *H01L 51/56* (2013.01); *H01L 51/5203* (2013.01); *H01L 21/02697* (2013.01)

(58) Field of Classification Search
    CPC . H01L 21/07; H01L 21/0274; H01L 21/0334; H01L 21/0332; H01L 21/0335; H01L 21/0337; H01L 51/56
    USPC .......................................................... 257/40
    See application file for complete search history.

(56) References Cited

U.S. PATENT DOCUMENTS

| | | | | |
|---|---|---|---|---|
| 2005/0023969 A1* | 2/2005 | Omata et al. | ................... | 313/504 |
| 2007/0252790 A1* | 11/2007 | Jung et al. | ........................ | 345/76 |
| 2008/0230798 A1* | 9/2008 | Huang et al. | .................... | 257/99 |
| 2010/0309172 A1 | 12/2010 | Oh et al. | | |

FOREIGN PATENT DOCUMENTS

| | | |
|---|---|---|
| KR | 10-2005-0091506 A | 9/2005 |
| KR | 10-2007-0000635 | 1/2007 |
| KR | 10-2010-0132155 A | 12/2010 |

\* cited by examiner

*Primary Examiner* — Cheung Lee
*Assistant Examiner* — Stephen Bradley
(74) *Attorney, Agent, or Firm* — Knobbe, Martens, Olson & Bear LLP

(57) ABSTRACT

A method of manufacturing an organic light emitting display panel is disclosed. The method may include forming a thin film layer using an open mask. The open mask may include forming a half-etching portion disposed over at least a portion of a non-display area. The non-display area may include a portion in which a first line crosses a second line. In a final product, a distance between a substrate and a lower surface of the half-etching portion may be longer than the distance between the substrate and a lower surface of a non-opening portion. Because of the half-etching portion, lines disposed in the non-display area may be prevented from contacting the open mask.

11 Claims, 12 Drawing Sheets

METHOD OF MANUFACTURING ORGANIC LIGHT EMITTING DISPLAY PANEL

CROSS-REFERENCE TO RELATED APPLICATIONS

This U.S. non-provisional patent application claims priority under 35 U.S.C. §119 of Korean Patent Application No. 10-2013-0053951, filed on May 13, 2013, which is hereby incorporated by reference in its entirety.

BACKGROUND

1. Field

The present disclosure relates to a method of manufacturing an organic light emitting display panel. More particularly, the present disclosure relates to a manufacturing method of an organic light emitting display panel, which is capable of improved reliability.

2. Description of the Related Technology

In general, an organic light emitting display device includes gate lines, data lines, source voltage lines, and pixels. Each pixel is connected to a gate line, a data line, and a source voltage line. The organic light emitting display device includes a gate driver that sequentially applies gate signals to the gate lines and a data driver that applies data signals to the data lines. Each pixel includes an organic light emitting device, a capacitor, and at least one transistor. The organic light emitting device also includes multiple layers. Each layer of the organic light emitting device is formed by a deposition method using an open mask.

SUMMARY OF CERTAIN INVENTIVE ASPECTS

The present disclosure provides a method of manufacturing an organic light emitting display panel, which is capable of preventing gate lines or data driver lines from being damaged. The method uses an open mask to improve reliability of the organic light emitting display panel.

In a first aspect, a method of manufacturing a display panel is disclosed. The method may include, for example, forming lines in a display area and a non-display area of a base substrate and forming a plurality of pixels in the display area.

In some embodiments, the lines include a first line and a second line insulated from the first line. In some embodiments, the second line crosses the first line in the non-display area. In some embodiments, the forming of the pixels includes forming a thin film layer using an open mask with a size corresponding to the display area. In some embodiments, the open mask includes a non-opening portion blocking a source material used to deposit the thin film layer and an opening portion corresponding to the display area for receipt of the source material during deposition. In some embodiments, the open mask includes a half-etching portion formed in a portion of the non-display area in which the first line crosses the second line. In some embodiments, a distance between the base substrate and a lower surface of the half-etching portion is greater than the distance between the base substrate and a lower surface of the non-opening portion.

In some embodiments, a driver is formed in the non-display area to drive the pixels. In some embodiments, the first line is a source voltage line electrically connected to the pixels. In some embodiments, the second line is a signal line electrically connected to the driver. In some embodiments, a driver is formed in the non-display area and configured to drive the pixels. In some embodiments, the first line is a data line used to apply a data signal to the pixels. In some embodiments, the second line is a signal line used to apply a control signal to the driver.

In some embodiments, the half-etching portion includes an area having a closed-loop shape positioned around a perimeter of the opening portion. In some embodiments, the half-etching portion extends to a boundary of the opening portion in the non-display area and is formed corresponding to the area in which the first line crosses the second line. In some embodiments, the half-etching portion has an island shape spaced apart from the opening portion while interposing a portion of the non-opening portion therebetween. In some embodiments, each of the pixels includes a thin film transistor and an organic light emitting device. In some embodiments, the thin film transistor includes a hole injection layer or a hole transporting layer. In some embodiments, the thin film transistor includes is an electron injection layer or an electron transporting layer. In some embodiments, the thin film transistor includes is a sealing layer. In some embodiments, the organic light emitting device is flexible.

In another aspect, lines formed in a non-display area of an organic light emitting display panel may be prevented from contacting the open mask because of the half-etching portion. Thus, in some embodiments, a burning phenomenon or short may be prevented in the lines and/or defects in driving the organic light emitting display panel may be prevented.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1:
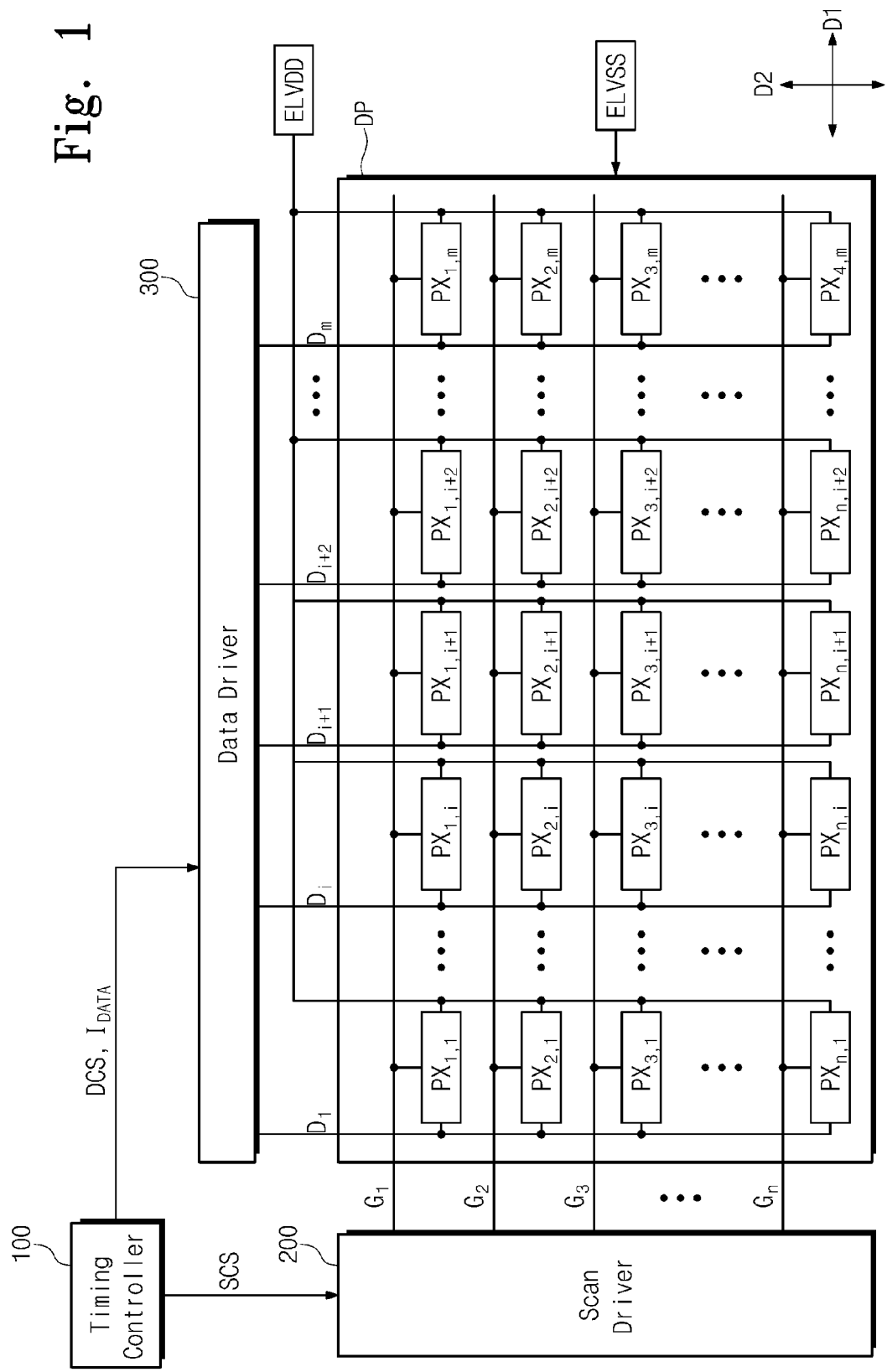
FIG. 1 is a block diagram showing an organic light emitting display device according to an exemplary embodiment of the present disclosure.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is to describe particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and will not be interpreted in an idealized or overly formal sense unless expressly so defined herein.

Hereinafter, the present invention will be explained in detail referring to the accompanying drawings.

FIG. 1 is a block diagram showing an organic light emitting display device according to an exemplary embodiment of the present disclosure. Referring to FIG. 1, an organic light emitting display device includes a display panel DP, a timing controller 100, a scan driver 200, and a data driver 300.

The display panel DP includes a base substrate BS (refer to FIG. 2), a plurality of gate lines G1 to Gn disposed on the base substrate BS, a plurality of data lines D1 to Dm disposed on the base substrate BS, and a plurality of pixels PX1,1 to PXn,m, each of which is connected to a corresponding gate line of the gate lines G1 to Gn and a corresponding data line of the data lines D1 to Dm. The gate lines G1 to Gn are extended in a first direction D1 on the base substrate BS and arranged in a second direction D2 crossing the first direction D1. The data lines D1 to Dm are insulated from the gate lines G1 to Gn while crossing the gate lines G1 to Gn. The data lines D1 to Dm are extended in the second direction D2 and arranged in the first direction D1. The display panel DP receives a first source voltage ELVDD and a second source voltage ELVSS. Each of the pixels PX1,1 to PXn,m is turned on in response to a corresponding scan signal. Each of the pixels PX1,1 to PXn,m receives the first source voltage ELVDD and the second source voltage ELVSS and generates a light in response to a corresponding data signal. The first source voltage ELVDD has a level higher than that of the second source voltage ELVSS.

Each of the pixels PX1,1 to PXn,m includes at least one transistor, at least one capacitor, and an organic light emitting device. During operation of the device, the transistor applies a voltage corresponding to the first source voltage ELVDD to the organic light emitting device, but the voltage output from the transistor may have a level lower than that of the first source voltage ELVDD. During operation of the device, the transistor controls a current flowing through the organic light emitting device according to the amount of charge in the capacitor. During operation of the device, the organic light emitting device generates the light corresponding to the voltage provided from the transistor and the second source voltage ELVSS.

During operation of the device, the timing controller 100 receives input image signals and outputs image data IDATA obtained by converting the input image signals based on an operation mode of the display panel DP and control signals SCS and DCS. During operation of the device, the scan driver 200 receives a scan driving control signal SCS from the timing controller 100 and generates a plurality of scan signals. The scan signals are sequentially applied to the gate lines G1 to Gn. During operation of the device, the data driver 300 receives a data driving control signal DCS and the image data IDATA from the timing controller 100. The data driver 300 generates a plurality of data signals based on the data driving control signal DCS and the image data IDATA. During operation of the device, the data signals are applied to the data lines D1 to Dm. The data driver 300 may be mounted on a tape carrier package or the display panel in a chip-on-glass method.

Figure 2:
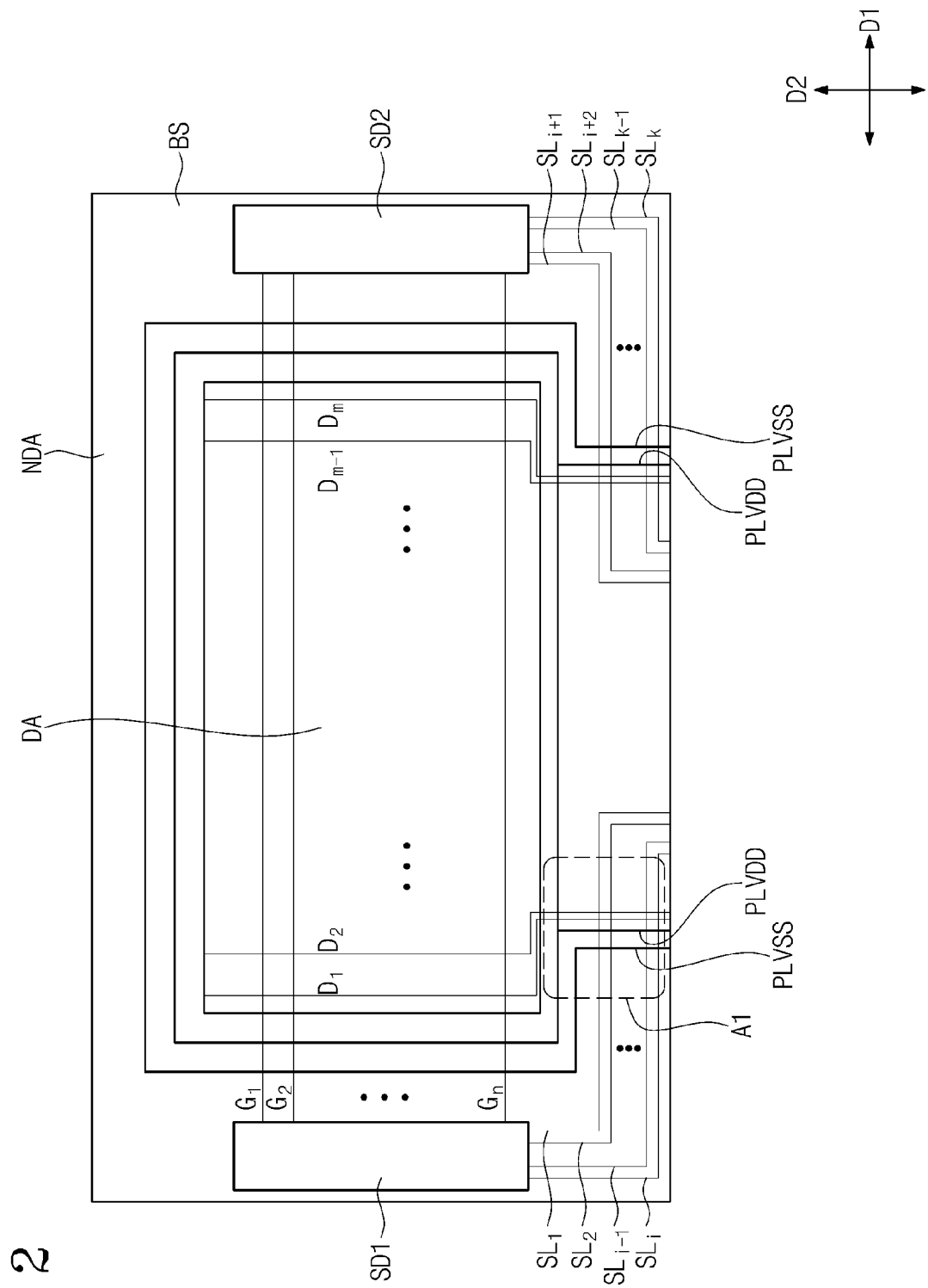
FIG. 2 is a plan view of a base substrate according to an exemplary embodiment of the present disclosure.

FIG. 2 is a plan view showing the base substrate according to an exemplary embodiment of the present disclosure. Referring to FIG. 2, the base substrate BS includes a display area DA and a non-display area NDA surrounding the display area DA. The base substrate BS includes the gate lines G1 to Gn, the data lines D1 to Dm, a first source voltage line PLVDD, a second source voltage line PLVSS, a plurality of signal lines SL1 to SLk, and scan driving circuits SD1 and SD2.

The first source voltage line PLVDD is disposed in the non-display area NDA to surround the display area DA. The first source voltage line PLVDD extends to a side of the base substrate BS along the second direction D2 and connected to a power supply (not shown). The first source voltage line PLVDD receives the first source voltage ELVDD from the power supply. The first source voltage line PLVDD extends to the display area DA to apply the first source voltage ELVDD to the pixels PX1,1 to PXn,m.

The second source voltage line PLVSS is disposed in the non-display area NDA to surround the display area DA and spaced apart from the first source voltage line PLVDD. The second source voltage line PLVSS is disposed at an outer portion of the first source voltage line PLVDD to surround the first source voltage line PLVDD, but it should not be limited thereto or thereby.

That is, the second source voltage line PLVSS may be disposed at an inner portion of the first source voltage line PLVDD. The second source voltage line PLVSS extends to the side of the base substrate BS along the second direction D2 and connected to the power supply (not shown). The second source voltage line PLVSS receives the second source voltage ELVSS from the power supply. The second source voltage line PLVSS extends to the display area DA to apply the second source voltage ELVSS to the pixels PX1,1 to PXn,m.

The scan driver 200 (refer to FIG. 1) includes a first scan driving circuit SD1 and a second scan driving circuit SD2, which are disposed at both sides of the display area DA. The gate lines G1 to Gn are disposed to cross the display area DA along the first direction D1. Both end portions of the gate lines G1 to Gn are connected to the first and second scan driving circuits SD1 and SD2, respectively, but they should not be limited thereto or thereby. Although not shown in FIG. 2, either one of the first and second scan driving circuits SD1 and SD2 may be connected to only left end portions of the gate lines G1 to Gn and the other one of the first and second scan driving circuits SD1 and SD2 may be connected to only right end portions of the gate lines G1 to Gn. In some embodiments, one of the first and second scan driving circuits SD1 and SD2 may be connected to odd-numbered gate lines of the gate lines G1 to Gn and the other one of the first and second scan driving circuits SD1 and SD2 may be connected to even-numbered gate lines of the gate lines G1 to Gn. The first and second scan driving circuits SD1 and SD2 receive a scan driving control signal SCS from the signal lines SL1 to SLk.

The data lines D1 to Dm are disposed in the display area DA and the non-display area NDA. The data lines D1 to Dm are extended in the second direction D2 on the display area DA. The data lines D1 to Dm are insulated from the gate lines G1 to Gn while crossing the gate lines G1 to Gn. The data lines D1 to Dm are extended to the non-display area NDA. The data lines D1 to Dm are extended to the side of the base substrate BS along the first direction D1 and connected to the data driver 300 (refer to FIG. 1). The signal lines SL1 to SLk are extended in the second direction D2 and arranged in the first direction D 1. One end portions of the signal lines SL1 to SLk are extended to the side of the base substrate BS and connected to the timing controller 100 (refer to FIG. 1). The other one end portions of the signal lines SL1 to SLk are disposed at both sides of the base substrate BS such that the other one end portions do not cross each other. Some signal lines SL1 to SLi, e.g., i signal lines from a left side of the base substrate BS, are extended to the left side of the base substrate BS along the first direction D1 and connected to the first scan driving circuit SD1. Remaining signal lines SLi+1 to SLk are extended to a right side of the base substrate BS along the first direction D1 and connected to the second scan driving circuit SD2. The signal lines SL1 to SLk are insulated from the first source voltage line PLVDD, the second source voltage line PLVSS, and the data lines D1 to Dm while crossing the first source voltage line PLVDD, the second source voltage line PLVSS, and the data lines D1 to Dm. The signal lines SL1 to SLk apply the scan driving control signal SCS from the timing controller 100 to the first and second scan driving circuits SD1 and SD2.

Figure 3:
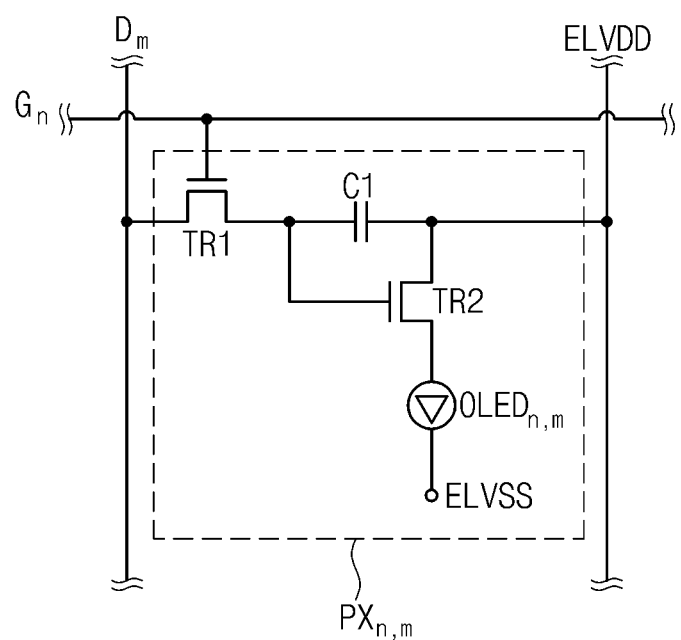
FIG. 3 is an equivalent circuit diagram showing a pixel according to an exemplary embodiment of the present disclosure.

FIG. 3 is an equivalent circuit diagram showing the pixel according to an exemplary embodiment of the present disclosure. Referring to FIG. 3, the pixel PXn,m includes a first transistor TR1, a second transistor TR2, the capacitor C1, and the organic light emitting device OLEDn,m. The first transistor TR1 includes a control electrode connected to an n-th gate line Gn, an input electrode connected to an m-th data line Dm, and an output electrode. The first transistor TR1 outputs the data signal applied to the m-th data line Dm in response to the scan signal applied to the n-th gate line Gn. The capacitor C1 includes a first electrode connected to the first transistor TR1 and a second electrode applied with the first source voltage ELVDD. The capacitor C1 is charged with the charges corresponding to a difference between the first source voltage ELVDD and the voltage corresponding to the data signal from the first transistor TR1. The second transistor TR2 includes a control electrode connected to the output electrode of the first transistor TR1 and the first electrode of the capacitor C1, an input electrode applied with the first source voltage ELVDD, and an output electrode. The output electrode of the second transistor TR2 is connected to the organic light emitting device OLEDn,m. The second transistor TR2 controls the current flowing through the organic light emitting device OLEDn,m according to the amount of charge in the capacitor C1. A turn-on time of the second transistor TR2 is determined by the amount of charge in the capacitor C1. During operation of the device, a lower voltage than that of the first source voltage ELVDD is applied to the organic light emitting device OLEDn,m through the output electrode of the second transistor TR2. The organic light emitting device OLEDn,m emits the light during the turn-on time of the second transistor TR2 and does not emit the light during a turn-off time of the second transistor TR2.

Figure 4:
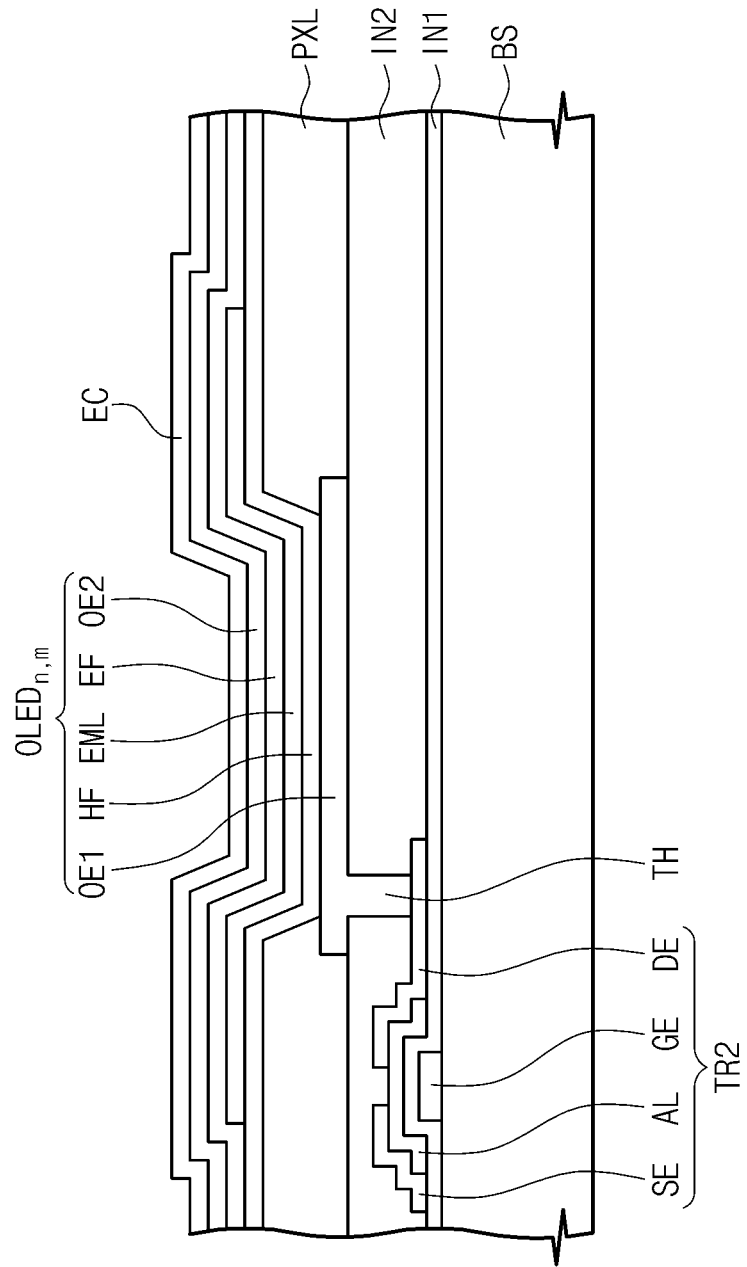
FIG. 4 is a cross-sectional view showing a pixel according to an exemplary embodiment of the present disclosure.

FIG. 4 is a cross-sectional view showing a pixel according to an exemplary embodiment of the present disclosure. Referring to FIG. 4, a first insulating layer IN1 is disposed on the base substrate BS to cover the control electrode GE of the second transistor TR2. The first insulating layer IN1 includes an organic layer and/or an inorganic layer. A semiconductor layer AL of the second transistor TR2 is disposed on the control electrode GE while interposing the first insulating layer IN1 therebetween. The input electrode SE and the output electrode DE of the second transistor TR2 are disposed to overlap with the semiconductor layer AL. The input electrode SE and the output electrode DE are spaced apart from each other. A second insulating layer IN2 is disposed on the first insulating layer IN1 to cover the input electrode SE and the output electrode DE. The organic light emitting device OLEDn,m is disposed on the second insulating layer IN2. A first electrode OE1 of the organic light emitting device OLEDn,m is disposed on the second insulating layer IN2, a hole function layer HF is disposed on the first electrode OE1, an organic light emitting layer EML is disposed on the hole function layer HF, an electron function layer EF is disposed on the organic light emitting layer EML, and a second electrode OE2 of the organic light emitting device OLEDn,m. The first electrode OE1 is connected to the output electrode DE of the second transistor TR2 through a contact hole TH formed through the second insulating layer IN2. The hole function layer HF includes a hole injection layer, or the hole injection layer and a hole transporting layer disposed between the hole injection layer and the organic light emitting layer EML. The electron function layer EF includes an electron injection layer, or the electron injection layer and an electron transporting layer disposed between the electron injection layer and the organic light emitting layer EML. When the organic light emitting device is flexible, a sealing layer EC is further disposed on the second electrode OE2. The sealing layer EC includes a plurality of organic layer and/or a plurality of inorganic layers. The sealing layer EC prevents moisture and oxygen from entering into the organic light emitting device OLEDn,m. Holes are injected from the first electrode OE1 and transported to the organic light emitting layer EML through the hole function layer HF. Electrons are injected from the second electrode OE2 and transported to the organic light emitting layer EML through the electron function layer EF. Holes and electrodes are recombined with each other in the organic light emitting layer EML and generate excitons, thereby emitting the light.

Figure 5:
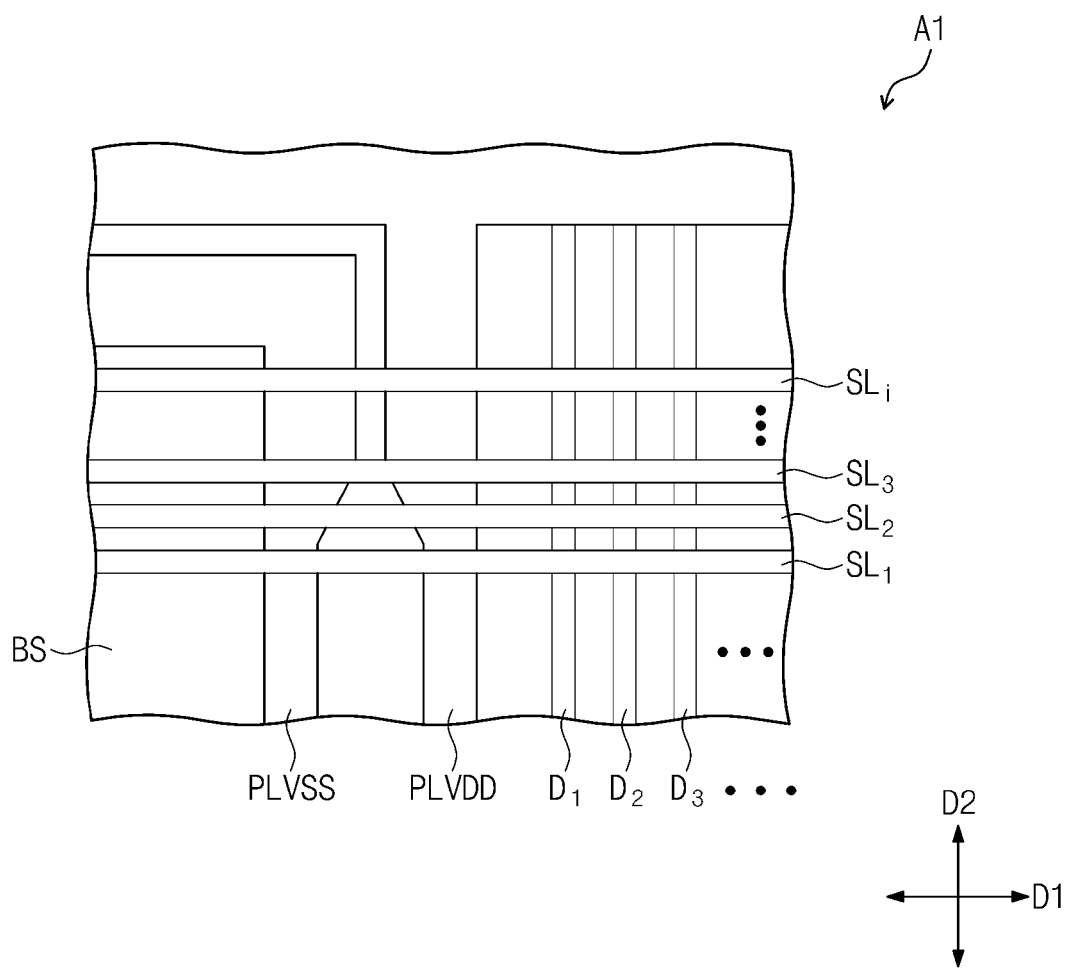
FIG. 5 is an enlarged plan view showing a portion A1 of the plan view of the base substrate shown in FIG. 2.

FIG. 5 is an enlarged plan view showing a portion A1 shown in FIG. 2. FIG. 5 shows a portion of the signal lines SL1 to SLi and a portion of the data lines D1 to Dm. Referring to FIG. 5, the first source voltage PLVDD, the second source voltage PLVSS, the data lines D1 to Dm, and the signal lines SL1 to SLi are disposed in the non-display area NDA of the base substrate BS. The one end portions of the first source voltage line PLVDD and the second source voltage line PLVSS are extended to a lower end of the base substrate BS along the second direction D2 and connected to the power supply (not shown). The other one end portions of the first source voltage line PLVDD and the second source voltage line PLVSS are extended in the first direction D1 to apply the voltage to the pixels PX1,1 to Pxn,m of the display panel. The data lines D1 to Dm are extended in the second direction D2 and arranged in the first direction D1. The signal lines SL1 to SLk are extended in the first direction D1 and arranged in the second direction D2. The data lines D1 to Dm are disposed adjacent to a right side of the first source voltage line PLVDD and sequentially arranged. The signal lines are insulated from the first and second source voltage lines PLVDD and PLVSS and the data lines D1 to Dm while crossing the the first and second source voltage lines PLVDD and PLVSS and the data lines D1 to Dm, but they should not be limited thereto or thereby. For instance, the data lines are disposed adjacent to a left side of the second source line PLVSS to cross the signal lines SL1 to SLi. In some embodiments, the data lines D1 to Dm may be formed not to overlap with the signal lines SL1 to SLi.

Figure 6:
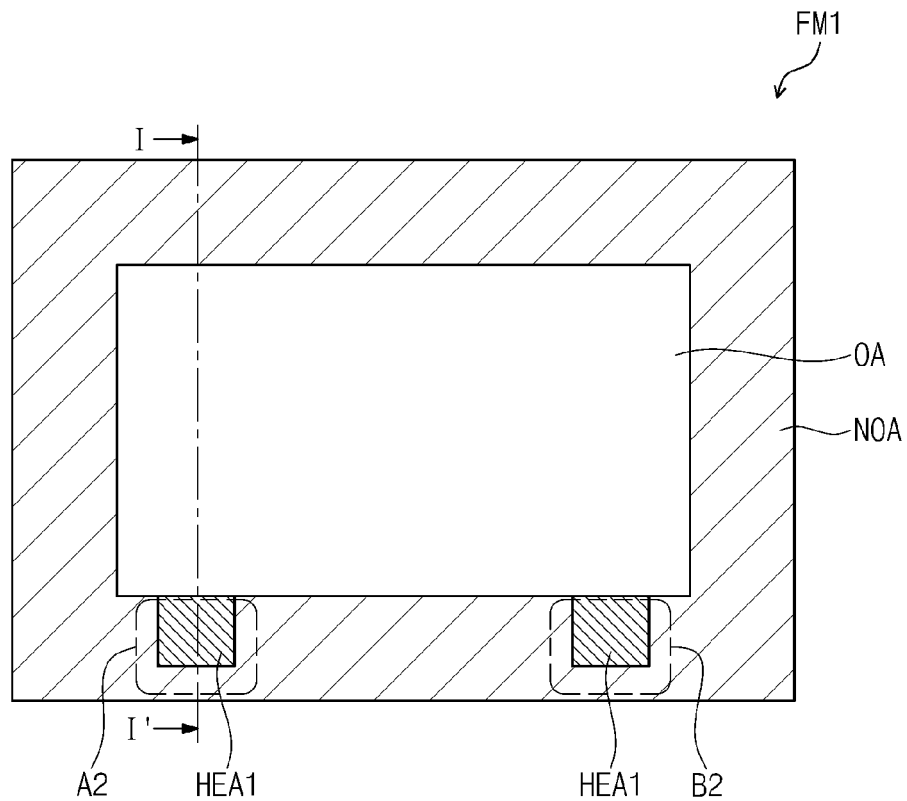
FIG. 6 is a plan view of a first open mask according to an exemplary embodiment of the present disclosure.

FIG. 6 is a plan view showing a first open mask according to an exemplary embodiment of the present disclosure. Referring to FIG. 6, a first open mask FM1 includes an opening portion OA, a non-opening portion NOA, and a first half-etching portion HEA1. The first open mask FM1 is used to form a thin film layer provided to all pixels PX1,1 to PXn,m. Accordingly, the opening portion OA of the first open mask FM1 is opened to correspond to the display area DA. A source material is deposited on the display area DA through the opening portion OA. The non-opening portion NOA is formed to correspond to the non-display area NDA. The non-opening portion NOA blocks the source material, so that the source material may be prevented from being deposited in the non-display area NDA. The first half-etching portion HEA1 is disposed on the non-display area NDA. The first half-etching portion HEA1 extends to a boundary of the opening portion OA in the non-display area NDA.

Figure 7:
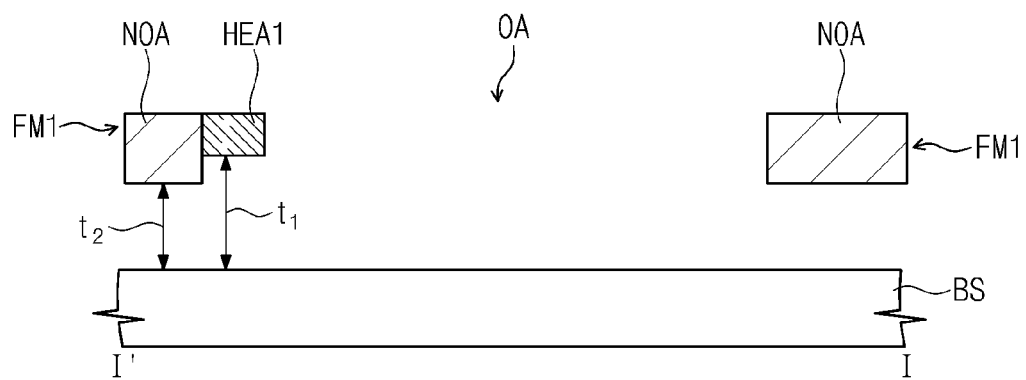
FIG. 7 is a cross-sectional view taken along a line I-I' of FIG. 6.

FIG. 7 is a cross-sectional view taken along a line I-I' of FIG. 6. Referring to FIG. 7, a distance t1 between the base substrate BS and a lower surface of the first half-etching portion HEA1 is longer than a distance t2 between the base substrate BS and a lower surface of the non-opening portion NOA. Accordingly, although the first open mask FM1 is disposed adjacent to the base substrate BS when the source material is deposited, the lines on the base substrate BS may be prevented from being chopped by a mask edge of the first open mask FM1.

Figure 8:
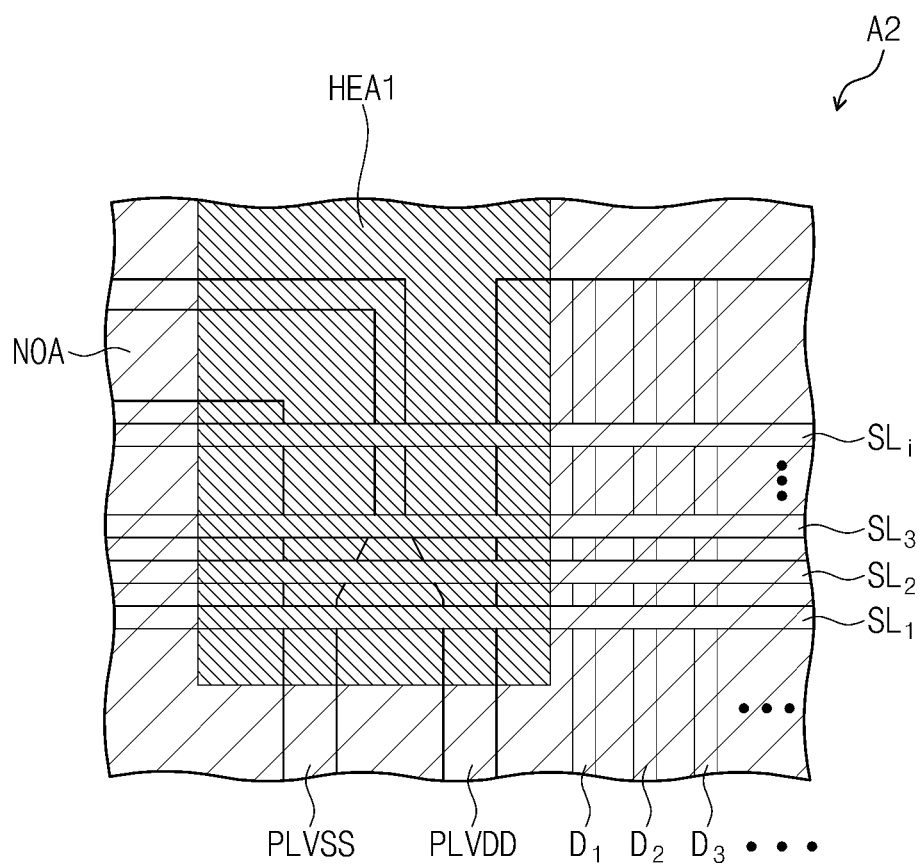
FIG. 8 is an enlarged plan view showing a portion A2 of the plan view of the first open mask shown in FIG. 6 according to an exemplary embodiment of the present disclosure.

FIG. 8 is an enlarged plan view showing a portion A2 shown in FIG. 6 according to an exemplary embodiment of the present disclosure. Referring to FIG. 8, the first half-etching portion HEA1 is disposed to correspond to at least area in which the first and second source voltage lines PLVDD and PLVSS cross the signal lines SL1 to SLk. FIG. 8 shows only the area in which a portion D1 to Dx of the data lines D1 to Dm crosses the portion SL1 to SLi of signal lines SL1 to SLk, and an area in which a remaining portion Dx+1 to Dm of the data lines D1 to Dm crosses the remaining portion SLi+1 to SLk of signal lines SL1 to SLk is included in the first half-etching portion HRA1 (refer to FIG. 6) disposed on the portion B2 of the first open mask FM1. The first half-etching portion HEA1 has an area wider than the area in which the first and second source voltage lines PLVDD and PLVSS cross the portion SL1 to SLi of signal lines SL1 to SLk. The first half-etching portion HEA1 extends to the boundary of the opening portion OA in the non-display area NDA. The first half-etching portion HEA1 prevents the lines in the area, in which the first and second source voltage lines PLVDD and PLVSS cross the portion SL1 to SLi of signal lines SL1 to SLk, from being chopped by the mask edge of the first open mask FM1. Thus, the first and second source voltage lines PLVDD and PLVSS may be prevented from being shorted with the portion SL1 to SLi of signal lines SL1 to SLk, so that a burning phenomenon or short may be prevented. In addition, since the half-etching area is partially performed, a reflow phenomenon, in which the source material infiltrates into the half-etching area, may be prevented, to thereby precisely pattern the lines.

Figure 9:
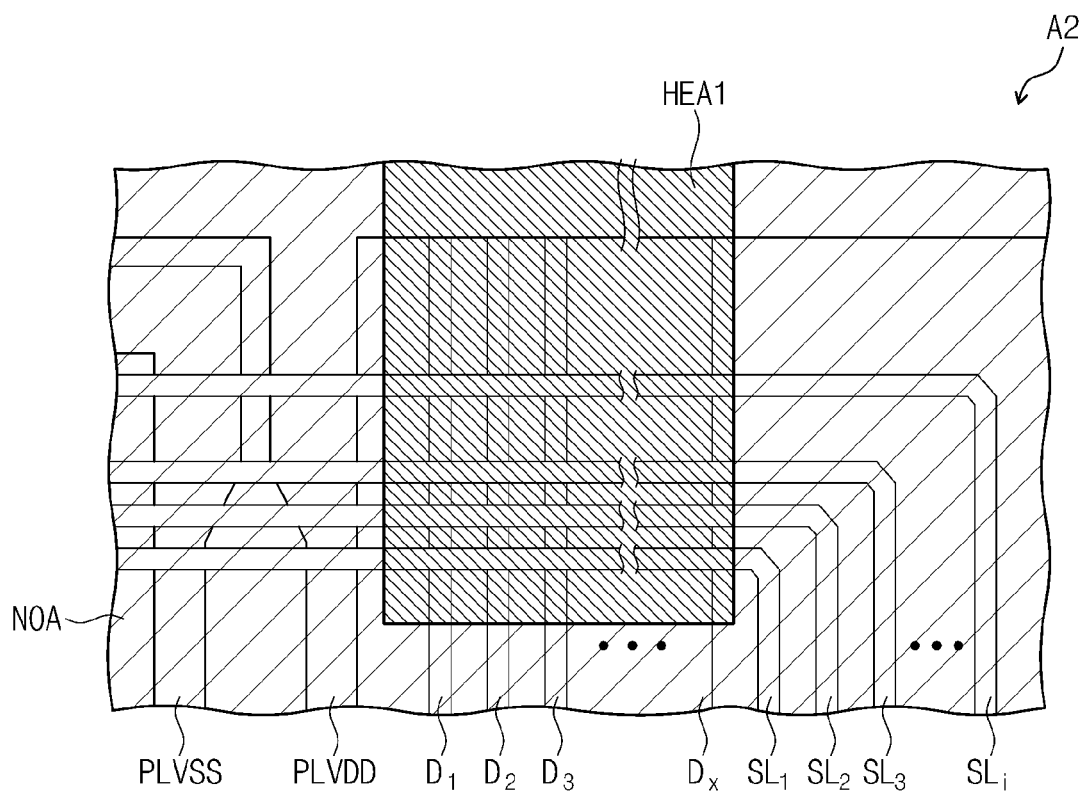
FIG. 9 is an enlarged plan view showing a portion A2 of the plan view of the first open mask shown in FIG. 6 according to another exemplary embodiment of the present disclosure.

FIG. 9 is an enlarged plan view showing a portion A2 shown in FIG. 6 according to another exemplary embodiment of the present disclosure. Referring to FIG. 9, the first half-etching portion HEA1 is disposed to correspond to at least area in which the data lines D1 to Dm cross the signal lines SL1 to SLk. FIG. 9 shows only the area in which a portion D1 to Dx of the data lines D1 to Dm crosses the portion SL1 to SLi of signal lines SL1 to SLk, and an area in which a remaining portion Dx+1 to Dm of the data lines D1 to Dm crosses the remaining portion SLi+1 to SLk of signal lines SL1 to SLk is included in the first half-etching portion HRA1 (refer to FIG. 6) disposed on the portion B2 of the first open mask FM1. The first half-etching portion HEA1 has an area wider than the area in which the portion D1 to Dx of data lines D1 to Dm cross the portion SL1 to SLi of signal lines SL1 to SLk. The first half-etching portion HEA1 extends to the boundary of the opening portion OA in the non-display area NDA. The first half-etching portion HEA1 prevents the lines in the area, in which the portion D1 to Dx of data lines D1 to Dm cross the portion SL1 to SLi of signal lines SL1 to SLk, from being chopped by the mask edge of the first open mask FM1. Thus, the portion D1 to Dx of data lines D1 to Dm may be prevented from being shorted with the portion SL1 to SLi of signal lines SL1 to SLk, so that a defect in driving the organic light emitting display device may be prevented.

Figure 10:
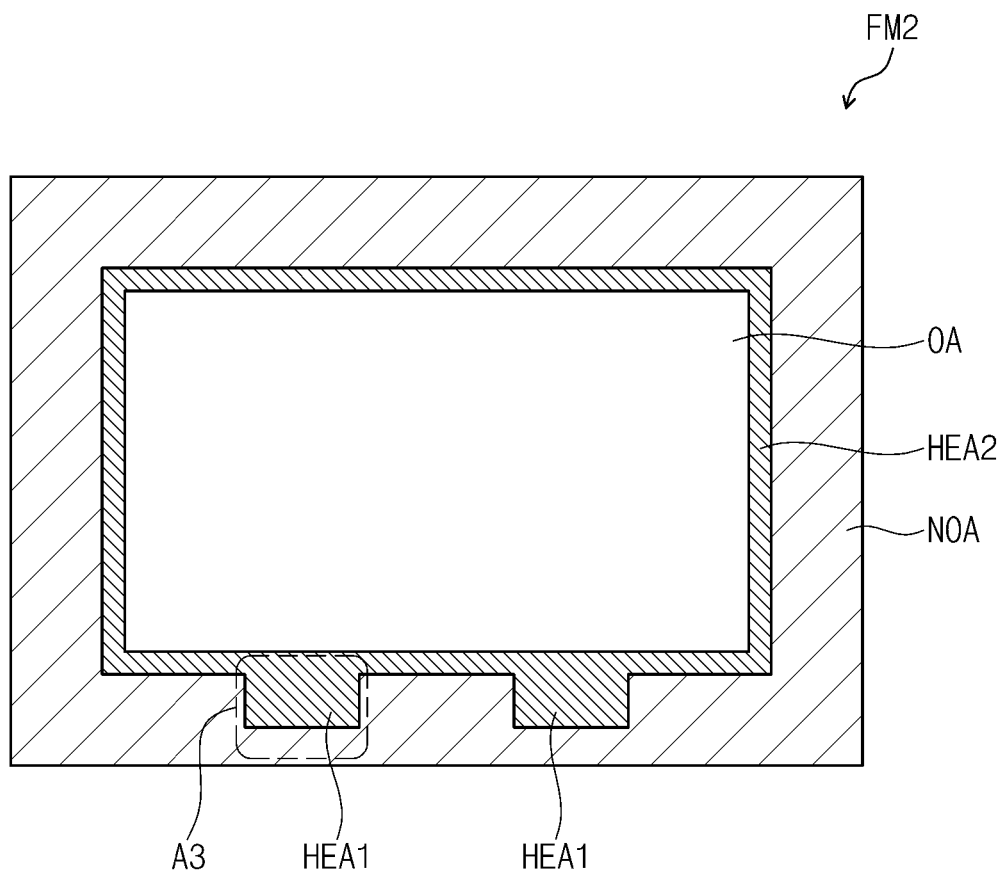
FIG. 10 is a plan view of a second open mask according to another exemplary embodiment of the present disclosure.
Figure 11:
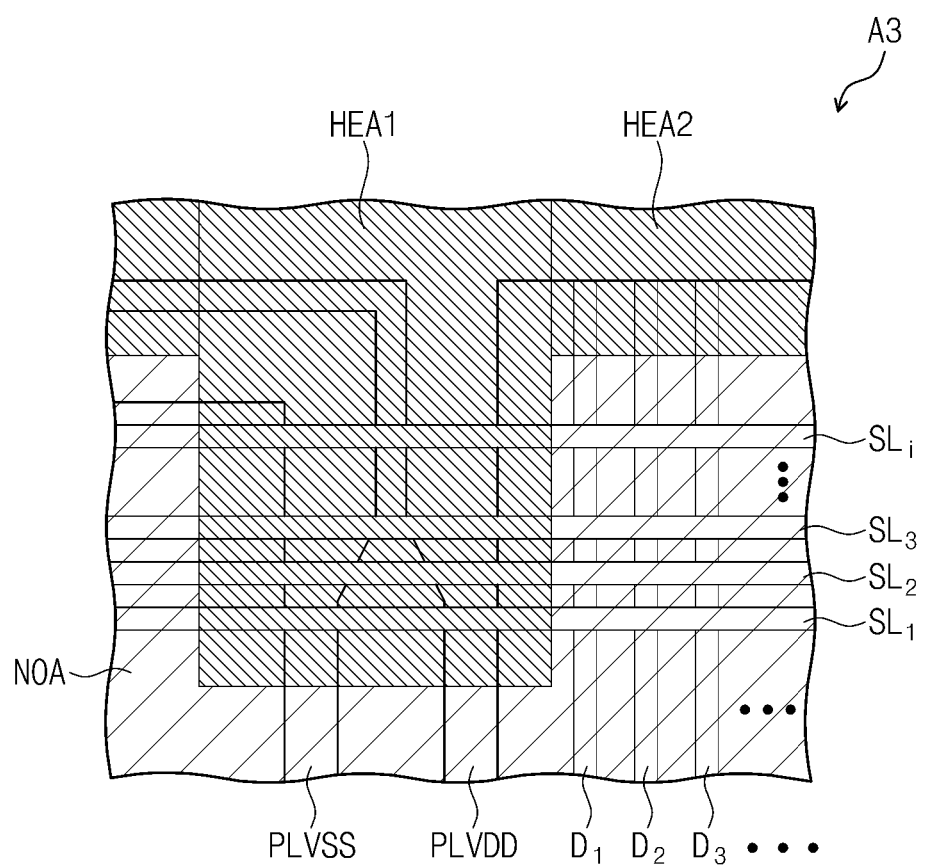
FIG. 11 is an enlarged plan view showing a portion A3 of the plan view of the second open mask shown in FIG. 10.

FIG. 10 is a plan view showing a second open mask according to another exemplary embodiment of the present disclosure and FIG. 11 is an enlarged plan view showing a portion A3 shown in FIG. 10. In the present exemplary embodiment, an opening portion OA and a non-opening portion NOA of a second open mask FM2 are the same as those of the first open mask FM1, and this detailed descriptions of the opening portion OA and the non-opening portion NOA of the second open mask FM2 will be omitted. Referring to FIG. 10, the second open mask FM2 includes a first half-etching portion HEA1 and a second half-etching portion HEA2. The second half-etching portion HEA2 is disposed on the non-display area NDA. The second half-etching portion HEA2 has a closed-loop shape to surround the opening portion OA. The second half-etching portion HEA2 extends to a boundary of the opening portion OA. In the present exemplary embodiment, a distance between the base substrate BS and a lower surface of the second half-etching portion HEA2 is longer than a distance between the base substrate BS and a lower surface of the non-opening portion NOA.

Referring to FIG. 11, the second open mask FM2 includes the first half-etching portion HEA1. The first half-etching portion HEA1 is disposed to correspond to at least an area in which the first and second source voltage lines PLVDD and PLVSS cross the signal lines SL1 to SLk. The second half-etching portion HEA2 extends in the first direction from both sides of the first half-etching portion HEA1. FIG. 11 shows only the area in which a portion D1 to Dx of the data lines D1 to Dm crosses the portion SL1 to SLi of signal lines SL1 to SLk. The second half-etching portion HEA2 prevents the lines crossing each other in the area corresponding to the closed-loop shape from being chipped by the mask edge. Therefore, defects in the lines and defects in driving caused by them may be prevented.

Figure 12:
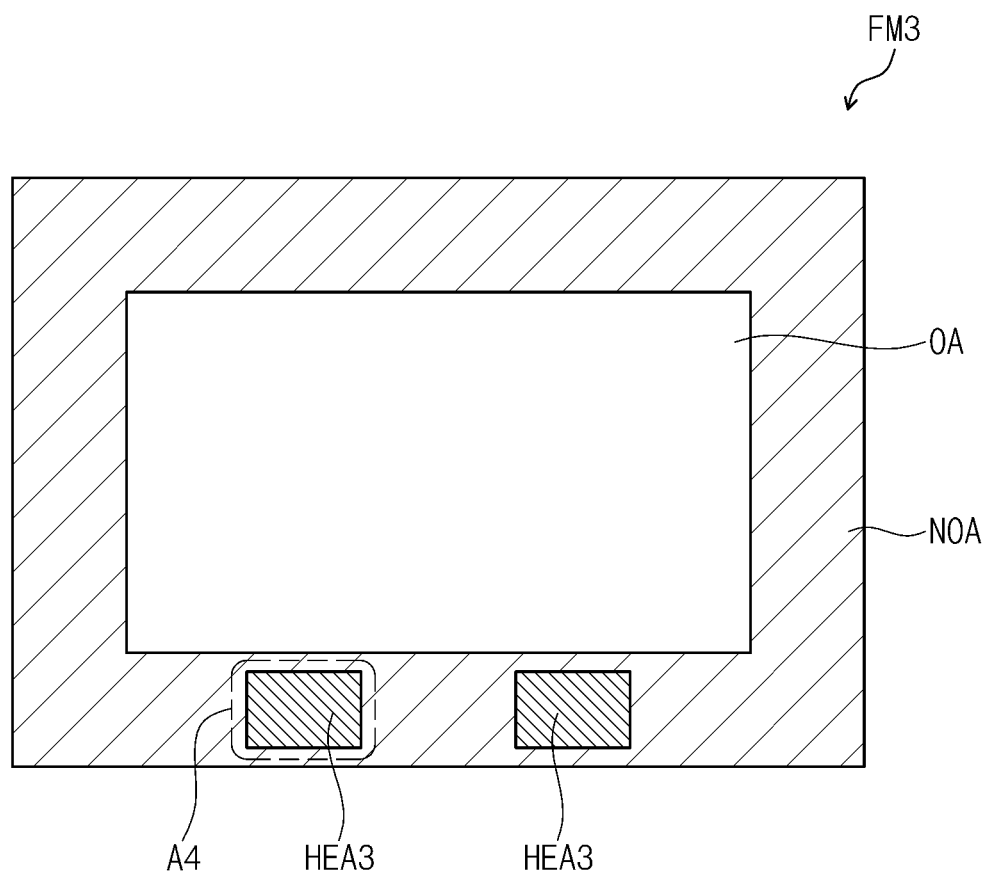
FIG. 12 is a plan view of a third open mask according to another exemplary embodiment of the present disclosure.
Figure 13:
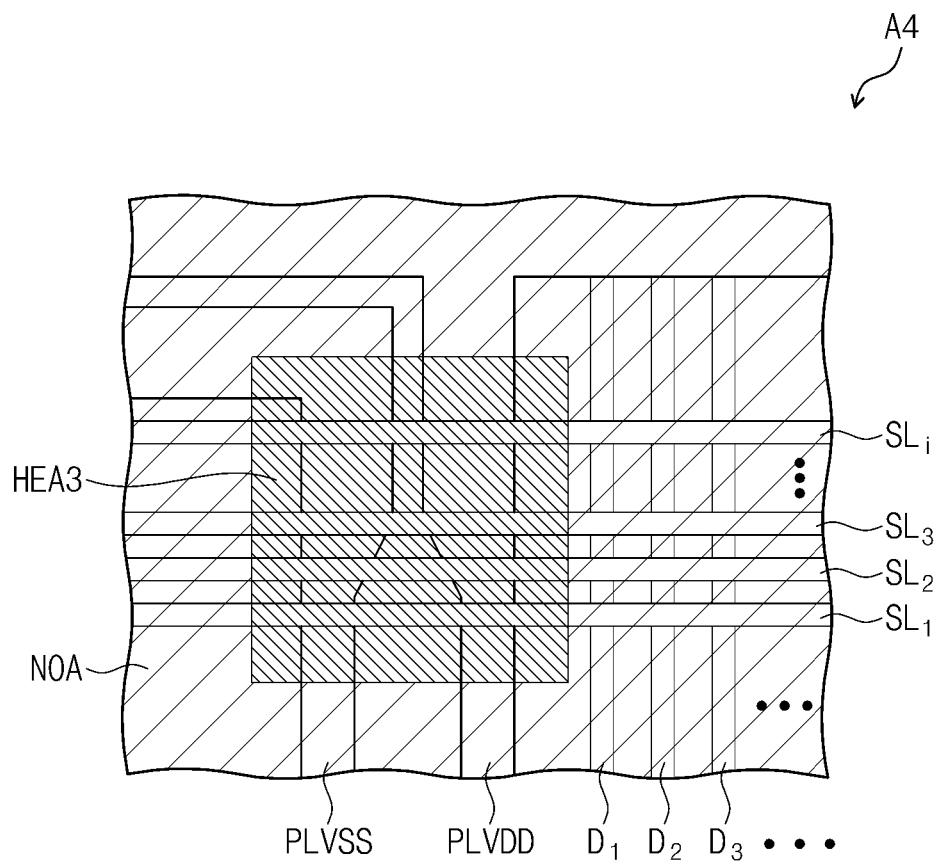
FIG. 13 is an enlarged plan view showing a portion A4 of the plan view of the third open mask shown in FIG. 12.

FIG. 12 is a plan view showing a third open mask according to another exemplary embodiment of the present disclosure and FIG. 13 is an enlarged plan view showing a portion A4 shown in FIG. 12. In the present exemplary embodiment, an opening portion OA and a non-opening portion NOA of a third open mask FM3 are the same as those of the first open mask FM1, and this detailed descriptions of the opening portion OA and the non-opening portion NOA of the third open mask FM3 will be omitted. Referring to FIG. 12, the third half-etching portion HEA3 is disposed on the non-display area NDA. The third half-etching portion HEA3 has an island shape to be spaced apart from the opening portion OA while interposing a portion of the non-opening portion NOA therebetween. In the present exemplary embodiment, a distance between the base substrate BS and a lower surface of the third half-etching portion HEA3 is longer than a distance between the base substrate BS and a lower surface of the non-opening portion NOA.

Referring to FIG. 13, the third half-etching portion HEA3 is disposed to correspond to at least an area in which the first and second source voltage lines PLVDD and PLVSS cross the signal lines SL1 to SLk.

FIG. 11 shows only the area in which a portion D1 to Dx of the data lines D1 to Dm crosses the portion SL1 to SLi of signal lines SL1 to SLk The third half-etching portion HEA3 has an area wider than the area in which the first and second source voltage lines PLVDD and PLVSS cross the portion SL1 to SLi of signal lines SL1 to SLk. The third half-etching portion HEA3 prevents the lines in the area, in which the first and second source voltage lines PLVDD and PLVSS cross the portion SL1 to SLi of signal lines SL1 to SLk, from being chopped by the mask edge of the third open mask FM3. Thus, the first and second source voltage lines PLVDD and PLVSS may be prevented from being shorted with the portion SL1 to SLk of signal lines SL1 to SLk, so that a burning phenomenon or short may be prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display panel, comprising:
   forming lines in a display area and a non-display area of a base substrate, the lines including a first line and a second line insulated from the first line in the non-display area; and
   forming a plurality of pixels in the display area, the forming of the plurality of pixels comprising forming a thin film layer using an open mask corresponding to the display area, the open mask comprising:
   a non-opening portion blocking a source material during deposition of the thin film layer,
   an opening portion corresponding to the display area to allow deposition of the source material; and
   a half-etching portion formed in an area of the non-display area in which the first line crosses the second line, wherein a distance between the base substrate and a lower surface of the half-etching portion is greater than the distance between the base substrate and a lower surface of the non-opening portion.

2. The method of claim 1, wherein a driver is formed in the non-display area, wherein the driver is electrically connected to the pixels, wherein the first line is a source voltage line electrically connected to the pixels, and wherein the second line is a signal line electrically connected to the driver.

3. The method of claim 1, wherein a driver is formed in the non-display area and is electrically connected to the pixels, wherein the first line is a data line electrically connected to the pixels, and wherein the second line is a signal line electrically connected to the driver.

4. The method of claim 1, wherein the half-etching portion further comprises an area having a closed-loop shape formed around a perimeter of the opening portion.

5. The method of claim 1, wherein the half-etching portion extends to a boundary of the opening portion in the non-display area, and wherein the half-etching portion is formed over the area in which the first line crosses the second line.

6. The method of claim 1, wherein the half-etching portion has an island shape that does not contact the opening portion, and wherein a portion of the non-opening portion is formed between the half-etching portion and the opening portion.

7. The method of claim 1, wherein each of the plurality of pixels comprises a thin film transistor and an organic light emitting device.

8. The method of claim 7, wherein the thin film layer is a hole injection layer or a hole transporting layer.

9. The method of claim 7, wherein the thin film layer is an electron injection layer or an electron transporting layer.

10. The method of claim 7, wherein the thin film layer is a sealing layer.

11. The method of claim 7, wherein the organic light emitting device is flexible.

\* \* \* \* \*